(12) United States Patent
Chiu (10) Patent No.: US 6,414,849 B1
(45) Date of Patent: Jul. 2, 2002

(54) LOW STRESS AND LOW PROFILE CAVITY DOWN FLIP CHIP AND WIRE BOND BGA PACKAGE

(75) Inventor: Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/429,045

(22) Filed: Oct. 29, 1999

(51) Int. Cl.$^7$ ................................................. H05K 7/02
(52) U.S. Cl. ..................... 361/760; 361/764; 361/690; 361/692; 361/807; 361/809; 257/778
(58) Field of Search ................................. 361/764, 760, 361/690, 692, 807, 809; 257/778

(56) References Cited

U.S. PATENT DOCUMENTS

| | | | | |
|---|---|---|---|---|
| 5,006,673 A | * | 4/1991 | Freyman et al. | 174/255 |
| 5,536,362 A | * | 7/1996 | Love et al. | 156/643.1 |
| 5,835,355 A | * | 11/1998 | Dordi | 361/760 |
| 5,910,686 A | * | 6/1999 | Hamzehdoost et al. | 257/778 |

OTHER PUBLICATIONS

Leo Higgins, PSGA and Solder BGA for HDI System Solutions, SEMICON Southwest Show Issue, Oct. 1998, vol., No. 6.

* cited by examiner

Primary Examiner—Jeffrey Gaffin
Assistant Examiner—Thanh Y. Tran
(74) Attorney, Agent, or Firm—Lisa K. Jorgenson; Daniel E. Venglarik (57) ABSTRACT

A low stress, low profile, cavity down wire bond or flip-chip BGA package is formed by injection molding or thermosetting of liquid crystal plastic (LCP) to form a die carrier including a polymer solder grid array (PSGA) of standoff posts formed during molding of the die carrier. The standoff posts are coated with copper during plating of the die carrier, on the surfaces of which conductive traces are etched from the standoff posts into a die cavity, including on the sidewalls of the die cavity, to wire bond sites or small solderable areas at the bottom of the cavity. After mounting of a wire bond or flip-chip integrated circuit die within the die cavity of the die carrier, the packaged integrated circuit is mounted on a main printed circuit board (PCB) substrate utilizing conductive paste to electrically connect the standoff posts to conductive solderable areas on the main PCB substrate. The high aspect ratio and/or large height of the plated standoff posts reduces stress on the solder joints and, combined with the flexibility of the LCP die carrier, improves solder joint reliability after reflow and during operation.

22 Claims, 6 Drawing Sheets

LOW STRESS AND LOW PROFILE CAVITY DOWN FLIP CHIP AND WIRE BOND BGA PACKAGE

BACKGROUND OF THE INVENTION

1. Field of the Invention

The present invention relates generally to integrated circuit packaging, and in particular to flip-chip and wire bond ball grid array (BGA) integrated circuit packages. Still more particularly, the present invention relates to forming a low stress and low profile cavity down flip chip and wire bond BGA package.

2. Description of the Related Art

Integrated circuit packaging technology is becoming a somewhat limiting factor in development of higher performance, packaged integrated circuits. Package designers are struggling to keep pace with the increase in pin count, size limitations, low profile mounting constraints, and other evolving requirements for packaging and mounting integrated circuits. One common packaging and package mounting solution currently being utilized is a ball grid array (BGA) package, in which an array of selective solderable areas for solder balls (or "bumps") are formed on the integrated circuit package. Conductive leads or traces on the package connect the selective solderable areas to wire bond sites for wire bonds connecting to the integrated circuit die within the package. A corresponding array of selective solderable areas are formed on a printed circuit board (PCB) substrate on which the packaged integrated circuit is to be mounted and connect, with conductive traces or leads, to other discrete or integrated circuit devices or to connector pins or edge connectors on the printed circuit board. Solder balls or bumps are formed on the selective solderable areas in the grid array of either the package or the PCB substrate, placed over the corresponding selective solderable areas in the other grid array, and then heated to a temperature sufficient to melt the solder balls and solder the package to the PCB substrate.

Within the integrated circuit package, the integrated circuit die is placed on a package substrate or within a cavity in a die carrier (which often also serves a heat sink or heat spreader). Wire bonds are formed connecting bonds pads on the integrated circuit die to corresponding nearby wire bond sites on the package substrate or die carrier, which are connected in turn by conductive traces or leads to selective solderable areas for solder bumps. The selective solderable areas on the package substrate or die carrier may be either on the same major surface of the package substrate or die carrier as the cavity and/or integrated circuit die, for mounting the packaged integrated circuit "cavity down" on the PCB substrate, or on the opposite major surface (or "side") from the cavity, for mounting the packaged integrated circuit "cavity up" on the PCB substrate. When the selective solderable areas on the die carrier are located on the opposite side of the package substrate die carrier from the die cavity, the conductive traces connecting the selective solderable areas to the wire bond sites near the cavity may pass through the package substrate or die carrier or around one or more edges of the package substrate or die carrier.

Figure 1:
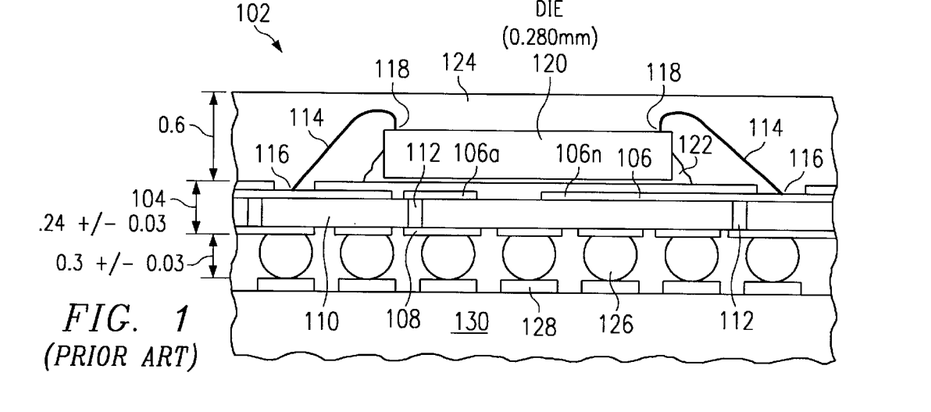
FIG. 1 illustrates a thin fine-pitch BGA wire bond package in accordance with the known art.

FIG. 1 illustrates a thin fine-pitch BGA (TFBGA) wire bond package 102 which, with respect to the present invention, represents a relatively early stage in the evolution of BGA packages. TFBGA package 102 includes a multilayer printed circuit board (PCB) substrate 104 having a first layer 106 of conductive traces and a second layer 108 of conductive traces on opposite sides of and separated by one or more insulating layer(s) 110. Plated through holes 112 are arranged throughout multilayer PCB substrate 104 to electrically connect wire bonding sites 106a–106n in the first layer 106 to conductive traces in the second layer 108, with bonding wires 114 extending between wire bonding sites 116 and corresponding bond pads 118 arranged upon the integrated circuit die 120. Integrated circuit die 120 is held in place upon PCB substrate 104 by a layer of adhesive 122, typically silver epoxy glue, and integrated circuit die 120, adhesive 122, bonding wires 114, wire bonding sites 116, and bond pads 118 are all enclosed by an encapsulating cap 124, such as a hardened plastic resin. By conventional solder-bumping and reflow processes, a plurality of solder balls 126 are arranged in a grid array on the opposite side of PCB substrate 104 from integrated circuit die 120 and attached to conductive traces 108. Solder balls 126 are then electrically connected to a solder ball attachment sites 128 on a main PCB 130, which may be any of a large variety of integrated circuit cards such as motherboards, adapter cards, and the like. TFBGA package 102 is typically about 1.15 millimeters (mm) thick, although the thickness may range from about 1.07 mm to about 1.23 mm.

Figure 2:
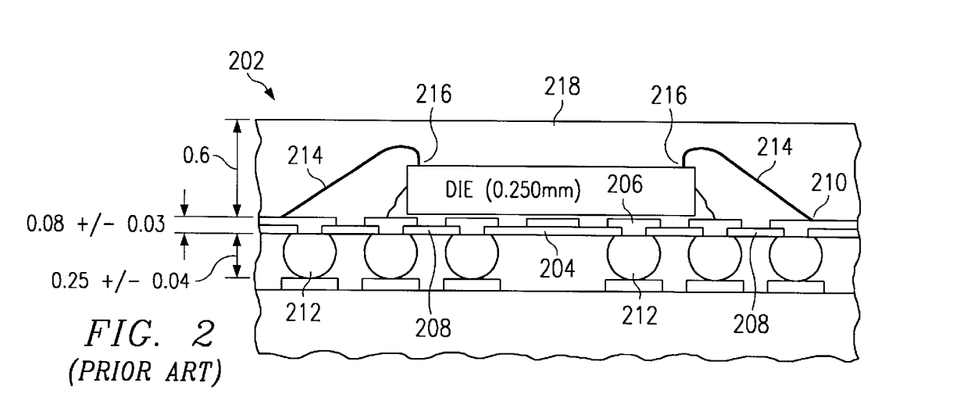
FIG. 2 illustrates a ultra fine-pitch BGA wire bond package in accordance with the known art.

FIG. 2 illustrates an ultra fine-pitch BGA (UFBGA) wire bonded package 202, the successor to TFBGA package 102 in the evolution of BGA packages. UFBGA package 202 includes a single-layer printed circuit board (PCB) substrate 204 having a metal tape layer 206 and plated through holes 208 arranged throughout PCB substrate 204 to electrically connect wire bonding sites 210 on an upper surface of PCB substrate 204 to conductive traces 212 on a lower surface of PCB substrate 204. Bonding wires 214 extend between and connect wire bonding sites 210 and bond pads 216 on the integrated circuit die 218. The remaining features of UFBGA package 202 parallel corresponding features of TFBGA package 102 in FIG. 1, except UFBGA package 202 is typically only about 0.93 mm thick, and generally no less than about 0.86 mm and no more than about 1.00 mm in thickness. This package style is thinner than TFBGA and is the preferred design for miniaturization.

Solder balls or bumps may also be employed in arrays in mounting integrated circuit die (or "chips") to the die carrier for thin packages. Bumped silicon chips, often referred to as "flip-chips" since they are mounted with the active layer side of the die adjacent to the die carrier rather than the backside, use a solder bump or ball to solder the electrical connections that interconnect integrated circuits within the die to conductive leads on the die carrier. Solder bumps or balls allow direct coupling between the pads on the silicon chip in which the integrated circuit is formed and matching contacts on the die carrier or package substrate. The flip-chip is aligned to the die carrier or package substrate and all connections are made simultaneously by reflowing the solder. A polymer underfill within the gap between the silicon chip and the package substrate is formed following reflow of the solder bumps to increase the mechanical integrity and reliability of integrated circuit packages.

Figure 3:
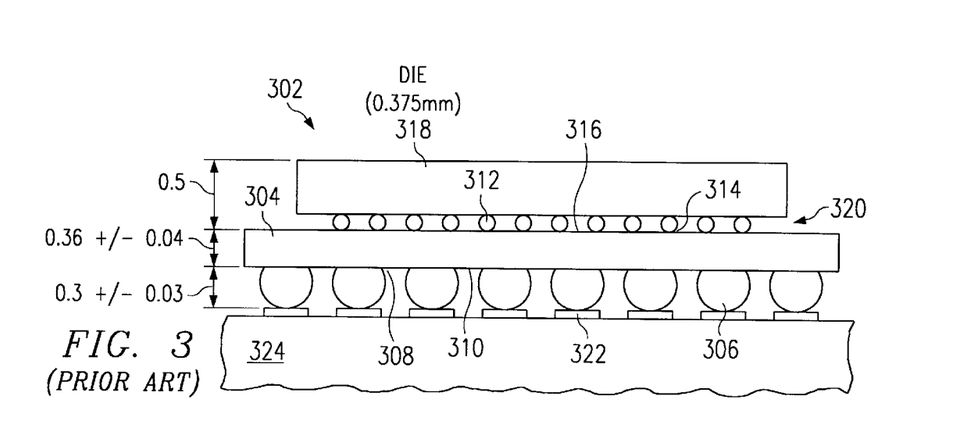
FIG. 3 illustrates a thin fine-pitch BGA flip-chip package in accordance with the known art.

FIG. 3 illustrates a thin fine-pitch BGA (TFBGA) flip-chip package 302, which followed and overlapped TFBGA and UFBGA wire bond packages in the evolution of BGA packages. Flip chip package 302 includes a single-layer printed circuit board (PCB) substrate 304, typically copper plated on both sides to receive solder balls 306 on conductive traces 308 disposed upon a lower surface 310 as well as smaller solder balls 312 at bonding sites 314 on an upper surface 316 of PCB substrate 304. Solder balls 306 and small solder balls 312 are arranged in a grid array and attached to conductive traces 308 and bonding sites 314 by conventional solder-bumping and reflow processes.

In flip-chip package 302, an integrated circuit die 318 is "inverted" and electrically connected at the surface of an "upper" or active layer to PCB substrate 304 via small solder balls 312 as described above. Afterwards an underfill material 320, typically epoxy, is disposed in all of the void space between integrated circuit die 318 and PCB substrate 304. Solder balls 306 are then electrically connected to solder ball attachment sites 322 on main PCB 324. Thus, flip-chip package 302 does not require bonding wires, and has a total typical thickness of about 1.14 mm, or within the range of about 1.07 mm to about 1.21 mm in total package thickness.

Figure 4:
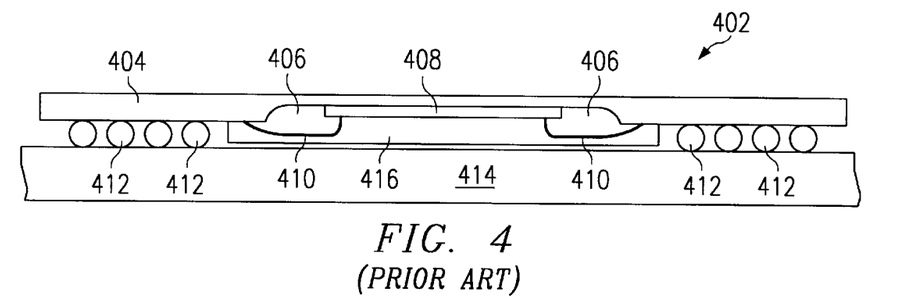
FIG. 4 illustrates a cavity down, high-performance BGA wire bond package in accordance with the known art.
Figure 5:
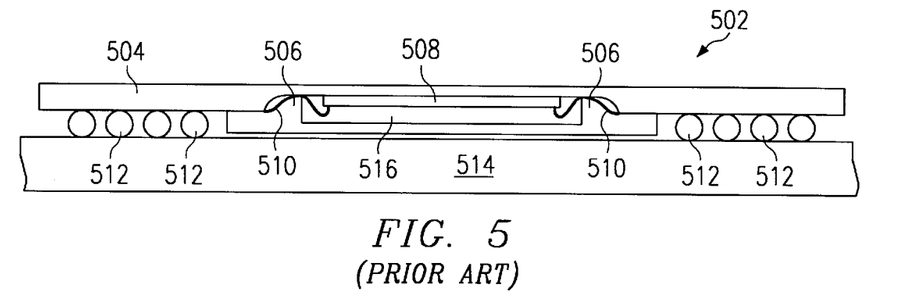
FIG. 5 illustrates an alternative cavity down, high-performance BGA wire bond package in accordance with the known art.

FIGS. 4 and 5 illustrate variations of a cavity down high performance BGA (HBGA) wire bond package 402, 502, which includes a die carrier or package substrate 404, 504 having a central cavity 406, 506 in which an integrated circuit die 408, 508 is attached, by an adhesive substance, to an interior surface of cavity 406, 506. Bond wires 410, 510 between bond pads on integrated circuit die 408, 508 and wire bonding sites on an insulating tape layer which surrounds cavity 406, 506, together with solder balls 412, 512, arranged in a grid array and electrically connected both to conductive traces formed on the insulating tape layer and to a main PCB 414, 514 at solder ball attachment sites, provide electrical connection from the integrated circuit die 408, 508 through the cavity down package 402, 502 to the PCB 414, 514 on which the package 402, 502 is mounted.

Integrated circuit die 408, 508, bonding wires 410, 510, the bonding pads on integrated circuit die 408, 508, and wire bonding sites on the insulating tape layer are encapsulated by an encapsulation cap 416, 516 with a slight clearance (approximately 5 mils), as shown, between encapsulation cap 416, 516 and main PCB 414, 514. Because integrated circuit die 408, 508 is sunken within cavity 406, 508, cavity down package 402, 502 can have a reduced overall height, useful for small or thin profile devices such as wireless telephones or pagers, hand-held personal digital assistants, and the like.

The packaging configuration illustrated in FIG. 4 requires solder balls 412 to have a final, assembled height of about 19 mils, which corresponds to an initial solder ball height (prior to collapse during reflow) of about 24–25 mils and a center-to-center spacing (or "grid pitch") between adjacent solder balls of approximately 50 mils. In order to increase the "pin" count, or the number of connections between the packaged integrated circuit and the PCB substrate on which the packaged integrated circuit is to be mounted, without increasing the size of the major surfaces of the package, a finer pitch solder ball array is required. Decreasing the pitch of the solder balls requires a commensurate decrease in their size, which reduces the stand-off between the packaged integrated circuit and the PCB substrate on which the packaged integrated circuit is mounted.

To reduce the height of the mounted, cavity down HBGA wire bond integrated circuit package when moving to finer pitched solder balls, the required thickness for the encapsulation cap is reduced, as shown by encapsulation cap 516 in FIG. 5, by connecting wire bonds 510 from bond pads on the integrated circuit die 508 to wire bonding sites inside the cavity 506, on an insulating tape layer which surrounds and extends into cavity 506 to provide wire bonding sites on the interior surface of cavity 506, rather than to the surface of package substrate 504. The resulting thinner encapsulation cap allows smaller, finer pitched solder balls to be employed, since less stand-off is required, which in turn results in a lower mounted package height. However, both of these packages (FIGS. 4 and 5) are based on multilayer construction, such as laminating various flat pieces together.

Unlike wire bond BGA packages, flip-chip BGA packages are almost universally assembled and mounted with the die carrier cavity up on PCB substrates because the solder balls between the package and the PCB substrate are too low and the flip-chip integrated circuit die are too thick. Solder balls employed to mount a BGA package on a PCB substrate generally only provide about 19–20 mils (approximately 0.5 mm) in stand-off between the BGA packaged integrated circuit and the PCB substrate—that is, the solder balls have a height of only about 20 mils after surface mount solder reflow. The integrated circuit die packaged within the BGA package are too thick—about 25–30 mils without back grind—to be successfully packaged in the BGA package and mounted cavity down on the PCB substrate with such a small amount of stand-off while remaining within target ranges for total-thickness or height of the mounted package.

Figure 6:
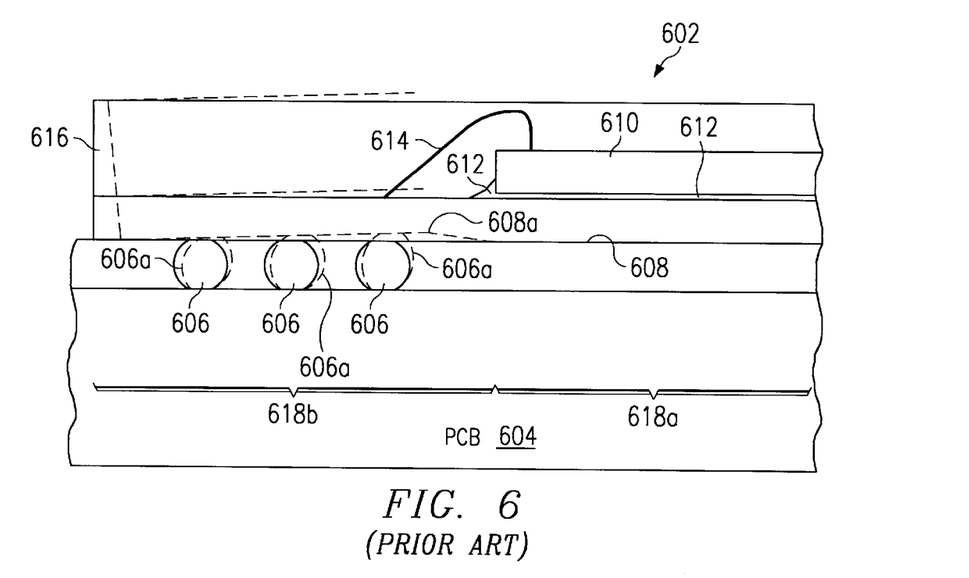
FIG. 6 illustrates the stress associated with differing thermal expansion rates within the BGA packages of FIGS. 1–5 in accordance with the known art.

Any BGA package that utilizes solder balls to conductively couple the packaged integrated circuit to a main PCB is susceptible to failure, particularly fatigue failure, due to temperature fluctuations and dissimilarity in thermal expansion rates for the components that form the BGA package. FIG. 6 illustrates, in an enlarged view of portion of a typical BGA package, the persistent problem of stress failure associated with all of the above varieties of BGA packages (wire bond or flip-chip, cavity up or cavity down). A cavity up wire bond BGA package 602 shown in FIG. 6 to be electrically connected to a main PCB 604 via solder balls 606 (which is selected as merely exemplary and may instead be a flip-chip, cavity down, or any other variant of BGA package that utilizes solder balls 606 to conductively couple BGA package 602 to a main PCB 604) includes a PCB substrate 608 to which is attached an integrated circuit die 610 via an adhesive layer 612. Bond wires 614 extend from conductive bond pads located on integrated circuit die 610 to wire bonding sites located upon PCB substrate 608, all of which are encapsulated, together with integrated circuit die 610, adhesive layer 612, and sealed together by an encapsulation cap 616.

BGA package 602 may be logically divided into three portions: a first portion 618a located beneath integrated circuit die 610; a second portion 618b enclosed within encapsulation cap 616, but not located beneath integrated circuit die 610; and a third portion 618c extending outward adjacent to encapsulation cap 616, which is not located beneath either integrated circuit die 610 or encapsulation cap 616. Although PCB substrate 608, integrated circuit die 610, adhesive layer 612, bonding wires 614, and encapsulation cap 616 each have separate and distinct coefficients of heat transfer and corresponding rates of thermal expansion, when these components are combined, as in first portion 618a, a single, "effective" coefficient of heat transfer (and a corresponding single, "effective" rate of thermal expansion) exists. Likewise, within second portion 618b, consisting of adhesive layer 612, bonding wires 614, and encapsulation cap 616, a single, "effective" coefficient of heat transfer and corresponding effective rate of thermal expansion is created, which will often differ from the effective rate of thermal expansion in first portion 618a and the effective rate of thermal expansion in third portion 618c.

For example, integrated circuit die 610 is made primarily of silicon and has a thermal expansion rate of about 26 parts per million (ppm) per degree Centigrade—that is, integrated circuit die 610 expands 26 inches per ° C. for every million inches along a particular dimension. On the other hand, PCB substrate 608 and main PCB 604 are typically made of fiber-glass or other non-conductive material and have thermal expansion rates of about 17 ppm/° C. Thus, BGA package 602 includes at least three portions 618a, 618b, and 618c that have dissimilar thermal expansion rates. For this reason, as BGA package 602 cools from the solder reflow temperature or undergoes ambient temperature changes during use, BGA package experiences thermal contraction (or expansion) at different rates in different portions, thereby stressing and staining solder balls 606. Such stressed and strained condition is depicted by solder balls 606a and PCB substrate 608a shown in dashed lines in FIG. 6. This stressed and strained condition of solder balls 606a results in a high stress concentration. The dashed lines (606a and 608a) represent the position(s) of BGA package 602 and solder balls 606 at high temperature, such as during reflow of solder; the solid lines (606 and 608) represent the positions of the respective components at room temperature.

Furthermore, electrical current flowing through BGA package 602 during operation cause BGA package to cyclically or intermittently heat up and cool down, which causes additional thermal expansion and contraction, although probably considerably less than at reflow. But, because of the stressed and strained condition of solder balls 606a after cooling from the reflow process, the cyclical or intermittent heating and cooling of BGA package 602 during normal operation may lead to fatigue failure of BGA package 602. Thin profile packages are more susceptible than thicker packages to this problem due primarily to the lower standoff height of the smaller solder balls.

It would be desirable, therefore, to provide a low stress and low profile cavity down flip chip and/or wire bond BGA package in which fatigue-failure from dissimilar thermal expansion rates is alleviated.

SUMMARY OF THE INVENTION

A low stress, low profile, cavity down wire bond or flip-chip BGA package is formed by injection molding or thermosetting of liquid crystal plastic (LCP) to form a die carrier including a polymer solder grid array (PSGA) of standoff posts formed during molding of the die carrier. The standoff posts are coated with copper during plating of the die carrier, on the surfaces of which conductive traces are etched from the standoff posts into a die cavity to wire bond sites or small solderable areas at the bottom of the cavity. After mounting of a wire bond or flip-chip integrated circuit die within the die cavity of the die carrier, the packaged integrated circuit is mounted on a main printed circuit board (PCB) substrate utilizing epoxy paste and/or solder paste to conductively couple the standoff posts to conductive solderable areas on the main PCB substrate. The high aspect ratio and/or large height of the plated standoff posts reduces stress on the solder joints and, combined with the flexibility of the LCP die carrier, improves solder joint reliability after reflow and during operation.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION OF THE INVENTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuits or packages and for assembling such packaged integrated circuit within electronic device. The present invention can be practiced in conjunction with other integrated circuit fabrication, packaging, and assembly techniques, and only so much of the process steps are included as are necessary for an understanding of the present invention. The figures representing cross-sections of portions of an integrated circuit or package during fabrication and assembly are not drawn to scale, but instead are drawn so as to illustrate the important features of the invention.

Figure 7:
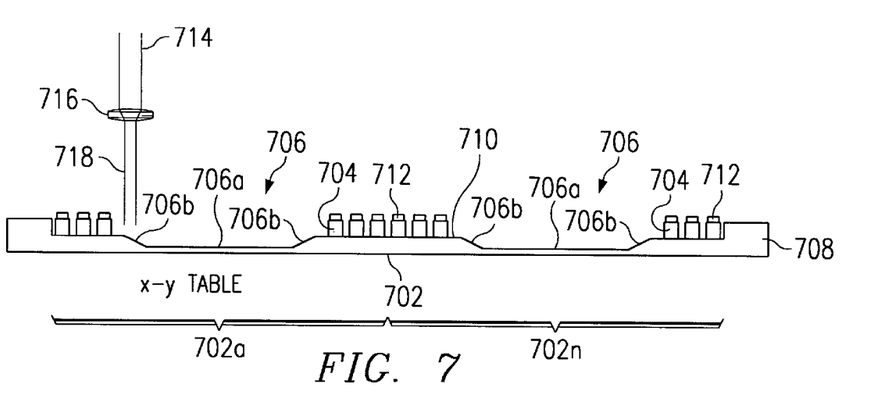
FIG. 7 depicts a package substrate and laser patterning and chemical etching process used to manufacture low stress and low profile cavity down flip chip and/or wire bond BGA packages in accordance with a preferred embodiment of the present invention.

With reference now to the figures, and in particular with reference to FIG. 7, a package substrate and laser patterning and chemical etching process used to manufacture low stress and low profile cavity down flip chip and/or wire bond BGA packages in accordance with a preferred embodiment of the present invention are depicted. The low stress and low profile cavity down BGA packages of the present invention are preferably manufactured utilizing a process similar to the Polymer Stud Grid Array™ (PSGA™) manufacturing process publicly disclosed in *High-Density Interconnect* (SEMICON Southwest Show Issue), vol. 1 no. 6 (October 1998), available at www.hdi-online.com and incorporated herein by reference. In the PSGA™ process, package substrates 702a–702n each having upraised standoff posts 704 and a central cavity 706 much deeper than the integrated circuit die thickness are formed (either individually or as part of an array within a flat substrate sheet 702 surrounded by a support edge 708) by injection molding or by a thermoset transfer molding process from a liquid crystal polymer (LCP) plastic or other suitable thermoplastic material. Standoff posts 704 are preferably cylindrical and extend perpendicularly outward from a top surface 710 of substrate sheet 702 with an aspect ratio (height-to-width) of greater than 1:1. Standoff posts 704 are formed with a height greater than 0.5 mm (about 20 mils) and are preferably approximately 1 mm tall with approximately 0.15 mm diameters. Each standoff post 704 terminates with a reduced diameter tip portion 712, the function of which is explained in greater detail below. Each PCB substrate 702a–702n includes a central recessed die cavity 706 having a flat central portion 706a surrounded by an inclined surface 706b. Die cavity 706 is preferably recessed a depth d of about 1 mm from top surface 710.

The LCP plastic package substrate 702 is then chemically prepared for plating and coated with copper and tin deposited on the plastic surface, including on posts 704, utilizing electroless and/or electrolytic copper and tin plating processes and chemistries commonly utilized to form printed circuit board ("PCB," also referred to as "printed wiring board" or "PWB") substrates. A high-speed laser 714 is employed to vaporize the tin, to create a negative of the desired circuit pattern of conductive traces on the package substrates 702a–702n. A laser imaging process with a focusing lens 716 providing a variable focal length is employed to selectively vaporize the tin over the sloped sidewall surfaces of cavities 706, removing the tin in areas where conductive traces are not desired. With a 30 µm diameter laser beam will remain sufficiently focused on inclined or sloped sidewalls 706b of cavity 706 to accurately vaporize the tin since the difference in height is so small—approximately 1 mm difference between the upslope and downslope edges of a 30 µm laser beam focused at the beam center—and falls within the depth of focus for such a laser beam, which is typically a few millimieters. Therefore, the focused laser beam 718 may be programmed to etch conductive traces in this manner on top surface 710, flat portion 706a, and inclined surfaces 706b of die carrier substrate 702 in a single routine, thereby eliminating the need for insulating tape with conductive traces thereon as utilized in the known art.

The copper without any tin overcoat is chemically etched away, and additional copper is plated over the remaining copper traces to form the final circuit pattern. Nickel and gold plating may be added to the patterned conductive traces on package substrates 702a–702n to provide improved wire bonding and soldering surfaces. Finally, any surrounding support edges are removed and the multiple LCP substrates are separated by conventional means into individual cavity down LCP substrates.

Figure 8A:
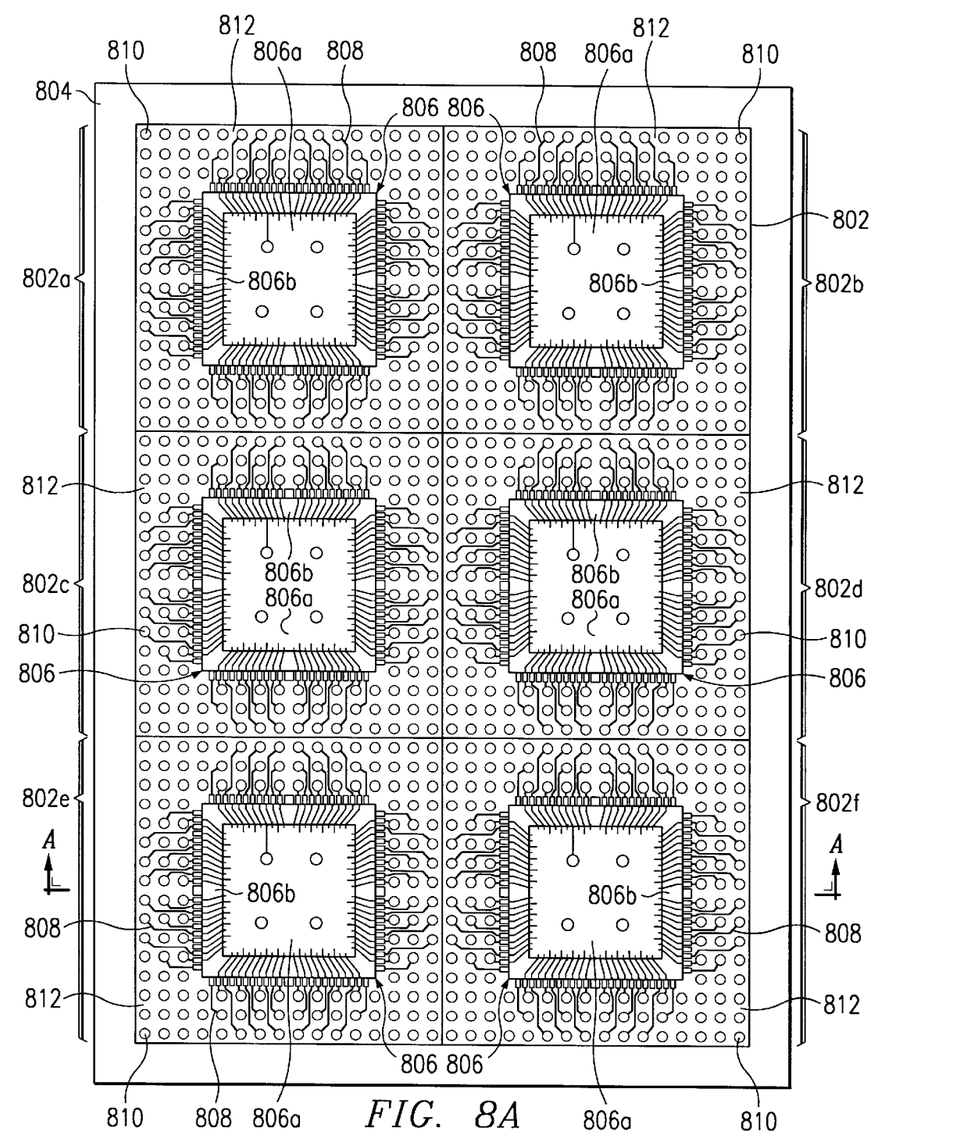
FIGS. 8A–8C illustrate a package substrate for a low stress and low profile cavity down, BGA package in accordance with a preferred embodiment of the present invention.
Figure 8B:
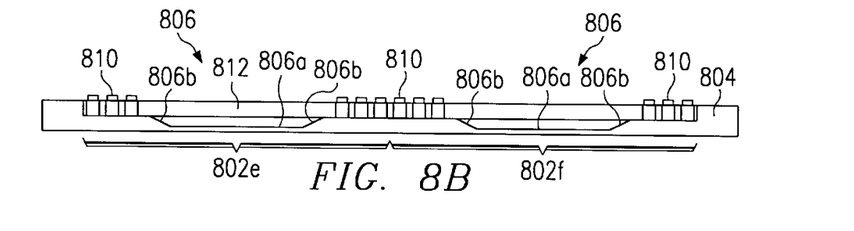
Figure 8C:
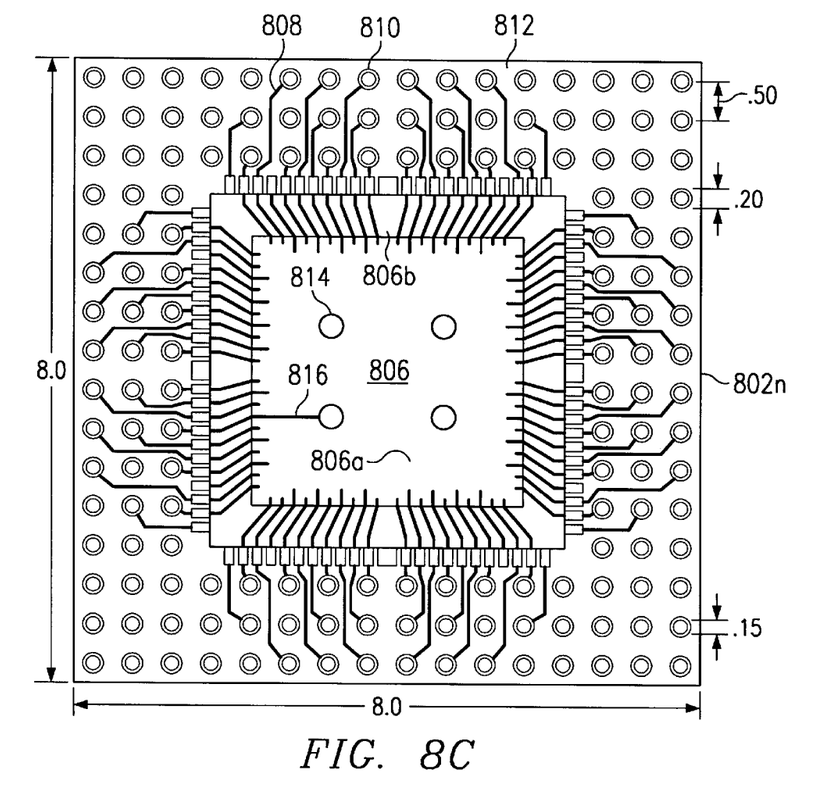

Referring now to FIGS. 8A through 8C, which are intended to be considered together and in conjunction with the following description, a package substrate for a low stress and low profile cavity down, BGA package in accordance with a preferred embodiment of the present invention is illustrates. FIG. 8A is a top or plan view of a LCP substrate sheet 802 comprised of six unseparated, individual LCP substrates 802a, 802b, 802c, 802d, 802e, and 802f. FIG. 8B is a cross-sectional view of FIG. 8A taken at section line A—A. LCP substrate sheet 802 is identical to LCP substrate sheet 702, and individual LCP substrates 802a, 802b, 802c, 802d, 802e, and 802f are identical to individual LCP substrates 702a and 702b (see FIG. 7) with the exception of the location of support edge 804 relative to the individual LCP substrates 802a–802f. Individual LCP substrates 802a–802f are preferably identical to each other. The details of unseparated, individual LCP substrates 802a–802f are represented further by an enlarged separated, individual LCP substrate 802n illustrated in FIG. 8C.

LCP substrate sheet 802 is surrounded along its periphery by a support edge 804. As stated above, individual LCP substrates 802a–802f are separated, and support edge 804 is removed, from LCP substrate sheet 802 by conventional means at the end of the manufacturing process. The exemplary embodiment depicted in FIGS. 8A, 8B and 8C represent, through individual LCP substrates 802a, 802b, 802c, 802d, 802e, and 802f, low stress and low profile cavity down wire bond BGA packages, as opposed to low stress and low profile cavity down flip-chip BGA packages. However, it will be apparent that the present discussion applies equally to the wire bond and flip-chip versions of the present invention.

Each LCP substrate 802a–802f includes a recessed central cavity 806. Central cavities 806 are identical to each other and to central cavity 706 (see FIG. 7). As such, central cavities 806 include inclined surfaces 806b that slope inwardly to flat portions 806a. As is shown, each LCP substrate 802a–802f includes a plurality of conductive trace lines 808 that extend from selected locations on flat portions 806a to selected upraised standoff posts 810 that extend perpendicularly outward from top portions 812 of LCP substrates 802a–802f, respectively. The conductive trace lines 808 are preferably laser etched by the focused laser beam over the entire length of inclined surfaces 802b as described above, eliminating the need for conductive traces formed on insulating tape.

Referring specifically now to FIG. 8C, LCP substrate 802n includes a recessed central cavity 806 having an inclined surface 806b that inclines inwardly and downwardly toward a flat surface 806a. Conductive trace lines 808 extend from selected locations on flat portion 806a to selected upraised standoff posts 810 that extend perpendicularly outward from a top surface 812 of LCP substrate 802n. Each upraised standoff post 810 terminates with a central, reduced diameter tip portion. A plurality of conductive through-hole apertures or "vias" 814 are located within flat portion 806a and pass through LCP substrate 802n, providing thermal dissipation. At least one such pass-through via 814 should be electrically connected to a conductive trace line 816 that is electrically grounded.

Although LCP substrate 802n is shown to be square, 8.0 mm in length and 8.0 mm in width, varying dimensions for LCP substrate may be utilized depending upon the application for which LCP substrate is to be used., Similarly, although upraised standoff posts 810 are shown to be arranged in an aligned array pattern and separated from each other at a pitch of 0.50 mm, center to center, the spacing and arrangement of upraised standoff posts 810 may be varied according to the application for which LCP substrate 802n is to be used. Likewise, although upraised standoff posts 810 are shown to be 0.20 mm in diameter, with tip portions shown to be 0.15 mm in diameter, these dimensions may be varied according to the application for which LCP substrate 802n is to be used without departing from the spirit of the present invention.

Figure 9A:
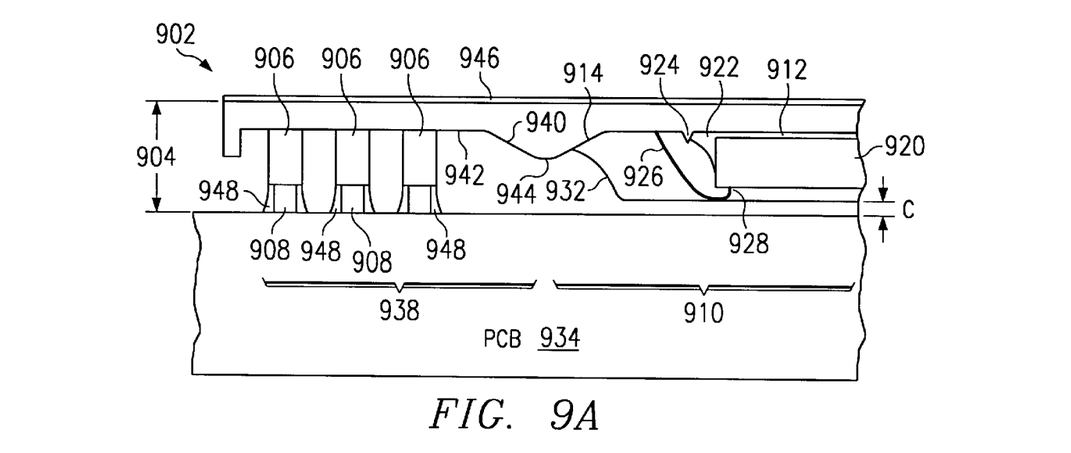
FIGS. 9A–9B depict a package substrate and an assembled and mounted package, respectively, for a low stress and low profile cavity down, BGA wire bond package in accordance with a preferred embodiment of the present invention.
Figure 9B:
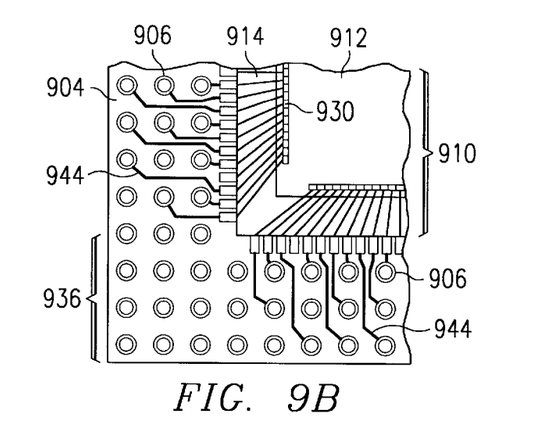

With reference now to FIGS. 9A and 9B, an assembled and mounted package and a package substrate, respectively, for a low stress and low profile cavity down, BGA wire bond package in accordance with a preferred embodiment of the present invention are depicted. FIG. 9A is a partial side view of a low stress, low profile, cavity down, wire bond BGA package 902 according to the present invention, while FIG. 9B is a top view of a quadrant of BGA package substrate 904 without the integrated circuit die mounted. BGA package 902 includes a LCP substrate 904, preferably molded from an LCP plastic, as described above and identical to LCP substrate 802n; therefore, LCP substrate 904 includes a plurality of upraised standoff posts 906. Each upraised standoff post 906 terminates with a reduced diameter tip portion 908. LCP substrate 904 includes a recessed central cavity 910 having a flat portion 912 and inclined portions 914.

Central cavity 910 receives an integrated circuit die 920 that is secured to flat portion 912 by a layer of adhesive 922, preferably epoxy, which is bounded by an underfill dam 924. A plurality of conductive bonding wires 926 extend from a plurality of bond pads 928 located upon integrated circuit die 920 to wire bonding sites 930 located within flat portion 912 of central cavity 910 on LCP substrate 904. Integrated circuit die 920, adhesive layer 922, bonding wires 926, bonding pads 930, and wire bonding sites 928 are encapsulated and sealed together by an encapsulation cap 932. Conductively plated (or "clad") upraised standoff posts 906 and tip portions 908 are sufficient in height to provide a clearance c between encapsulation cap 932 and a main PCB 934. Upraised standoff posts 906 may project from a flat peripheral surface 936 on LCP substrate 904 as depicted in FIG. 9B or from a peripheral cavity 938 including inclined surface 940 and flat surfaces 942 as illustrated in FIG. 9A. Central cavity 910 and peripheral cavity 938 may have equal or different depths. Central cavity 910 may be made very deep to make a package having a thickness not substantially greater than the thickness of integrated circuit 920.

A plurality of conductive traces 944 are laser etched by the above described process according to the present invention from selected wire bonding pads 930 to selected upraised standoff posts 906. The laser etching process according to the present invention allows conductive traces 944 to be laser etched along the entire extent of inclined surfaces 914 as well as on flat region 912 within central cavity and flat peripheral region 936 or inclined surface 940 and flat surface 942. As is conventional, LCP substrate 904 includes or receives a full plane electromagnetic interference shield 946, typically consisting of a metal alloy plating containing copper, nickel, and/or gold.

The conductive connection of LCP substrate 904 to main PCB 934 can best be explained with reference to FIG. 9A. It is preferred that LCP substrate 904 be electrically connected, or soldered, to main PCB 934 by a conventional solder paste screening process. Solder paste screening processes do not require the use of solder balls, but instead utilize a conductive paste containing solder particles mixed with solvent, which removes oxidation film formed around the soldering area during reflow soldering to facilitate a good soldering. However, the present invention may also employ conductive epoxy as described above to conductively couple LCP substrate 904 to main PCB board 934, with or without solder paste screening processes. The reduced diameter tips 908 of standoff posts 906 are inserted into the solder paste or reflowed solder ball 948 to form the contact connection, and allow the soldered contacts to have a diameter not substantially greater than the largest diameter of standoff posts 906 so that a fine pitch for standoff posts 906 may be employed.

Because BGA package 902 is of the wire bond version, an encapsulation cap 932 is required and limits assembled height or profile of BGA package 902. A lower profile may be achieved by utilizing flip-chip small solder ball connection of the integrated circuit die to the BGA package, particularly if the integrated circuit die is thinned after fabrication by a back grind.

Figure 10A:
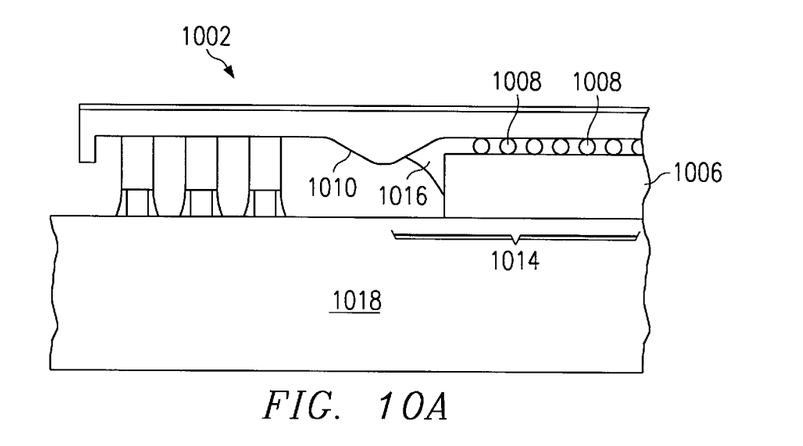
FIGS. 10A–10B illustrate a package substrate and an assembled and mounted package, respectively, for a low stress and low profile cavity down, BGA flip-chip package in accordance with a preferred embodiment of the present invention.
Figure 10B:
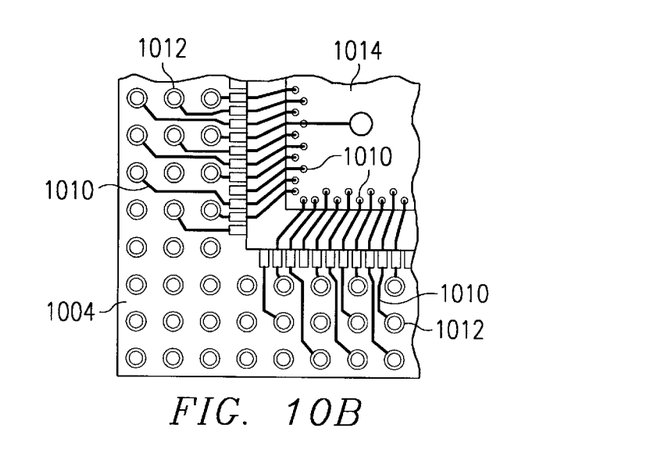

Referring to FIGS. 10A and 10B, a package substrate and an assembled and mounted package, respectively, for a low stress and low profile cavity down, BGA flip-chip package in accordance with a preferred embodiment of the present invention are illustrated. FIG. 10A is a partial side view of a low stress, low profile, cavity down, flip-chip BGA package 1002 according to the present invention, while FIG. 10B is a top view of a quadrant of LCP substrate 1004 within BGA package 1002 without the integrated circuit die mounted. BGA package 1002 is substantially the same in construction and mounting as BGA package 902 depicted in FIGS. 9A–9B, except that flip-chip integrated circuit die 1006 is electrically connected to die carrier or LCP substrate 1004 by solder balls 1008 as described above. Conductive traces 1010 etched on the surface of die carrier/LCP substrate 1004 extend from selected plated standoff posts 1012 (i.e., posts plated with conductive cladding) over the inclined surface of the cavity 1014 to the flat surface at the bottom of cavity 1014. Underfill 1016 provides mechanical strength to the solder ball connections of integrated circuit die 1006 to die carrier 1004. No encapsulating cap is required, permitting a lower profile package to be formed and mounted on the main LCP board 1018. With a central cavity 1014 of sufficient depth, the overall package may have a thickness not substantially greater than integrated circuit die 1006.

Figure 11:
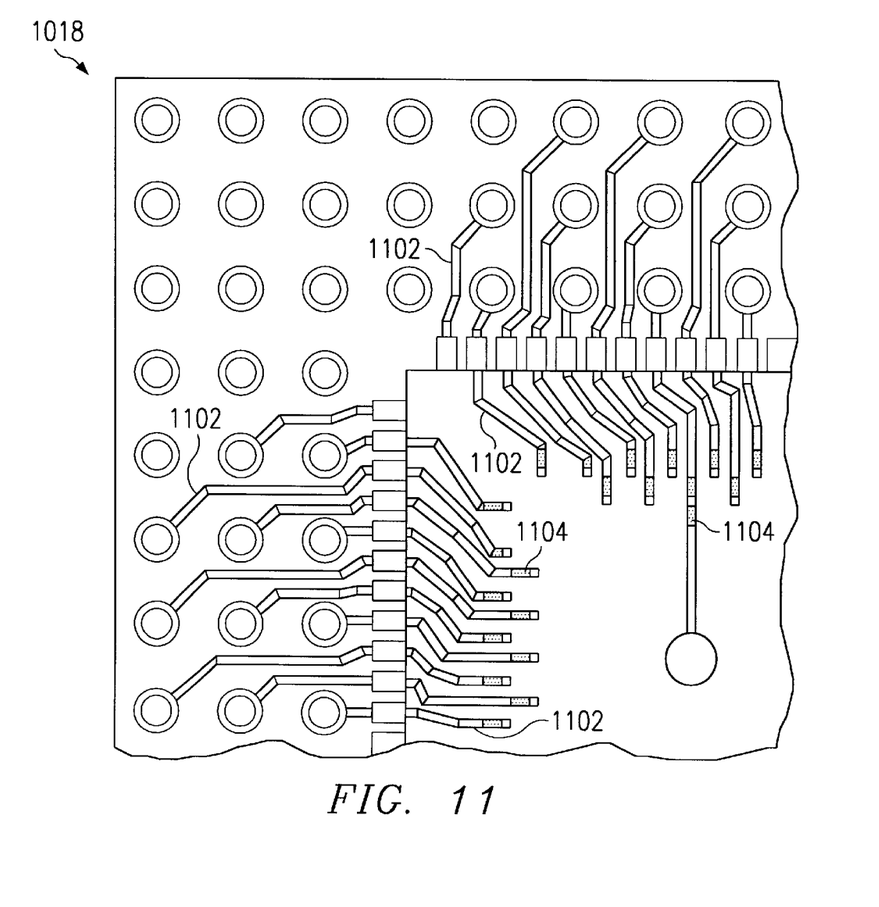
FIG. 11 depicts an enlarged view of a quadrant of a low stress and low profile cavity down BGA package in accordance with a preferred embodiment of the present invention.

With reference now to FIG. 11, an enlarged view of a quadrant of a low stress and low profile cavity down BGA package in accordance with a preferred embodiment of the present invention is depicted. In the present invention, conductive traces 1102 may be coated in selected regions near the ends in the bottom of the cavity with laser applied black oxide "bump pads" 1104 for controlling the formation of solder bumps on the ends of the conductive traces. Solder paste and reflowed solder will not adhere to oxide bump pads 1104 as well as to conductive traces 1102, allowing the area at the end of conductive traces 1102 on which solder bumps are formed to be delimited by bump pads 1104. Black oxide bump pads 1104 are formed by heating selected regions of conductive traces 1102 to a temperature at which the metal, typically copper or a copper alloy, reacts with ambient oxygen to form and oxide. Formation of black oxide bump pads 1104 may be performed at the completion of patterning of conductive traces 1102.

No solder balls are employed in mounting a BGA packaged integrated circuit to a LCP board in the present invention. Instead, cylindrical columns molded with the package substrate or die carrier and metallized during copper plating of the package substrate or die carrier, act like copper leads of conventional packages (e.g., quad flat package or "QFP") and are joined to the LCP board by conventional surface mount solder reflow processes. These molded columns preferably have a high aspect ratio (e.g., greater than 1) and/or a height (e.g., 1 mm versus 0.5 mm) to reduce stress on the solder joints. Additionally, the height of the columns together with the flexibility of the plastic employed for the die carrier (e.g., LCP versus fiberglass substrate material of conventional BGA package) gives the mounted BGA package better solder joint reliability. A full metal plane on the outside of the package provides EMI shielding, and large vias in the die carrier provide thermal dissipation. The package may be mounted cavity down for either wire bond BGA integrated circuits or, with a lower mounted profile or height from the surface of the LCP board, flip-chip BGA integrated circuits.

While the invention has been particularly shown and described with reference to a preferred embodiment, it will be understood by those skilled in the art that various changes in form and detail may be made therein without departing from the spirit and scope of the invention.

What is claimed is:

1. A integrated circuit package, comprising:
   a die carrier having a central cavity for receiving an integrated circuit die, the central cavity having sloped sidewalls and a flat bottom;
   a plurality of conductively clad standoff posts integrally formed with the die carrier and extending from a surface of the die carrier around the central cavity; and
   a plurality of conductive traces formed on a surface of the die carrier, each of the plurality of conductive traces extending from one of the plurality of standoff posts over the surface of the die carrier around the central cavity, over the sloped sidewalls of the central cavity, and at least partially over the flat bottom of the central cavity.

2. The integrated circuit package of claim 1, wherein each of the plurality of conductive traces terminates, at an end within the central cavity, in a bonding pad for wire bonding connection of the integrated circuit die to the conductive traces.

3. The integrated circuit package of claim 1, wherein each of the plurality of conductive traces terminates, at an end within the central cavity, in a bonding pad for solder ball connection of the integrated circuit die to the conductive traces.

4. The integrated circuit package of claim 1, wherein the central cavity has a depth approximately equal to a thickness of the integrated circuit die.

5. The integrated circuit package of claim 1, further comprising:
   the integrated circuit die mounted within the die cavity;
   a resin securing the integrated circuit die to the die carrier.

6. The integrated circuit package of claim 5, further comprising:
   wire bonds connecting the integrated circuit die to the conductive traces; and
   an encapsulation cap encapsulating the integrated circuit die and the wire bonds.

7. The integrated circuit package of claim 5, further comprising:
   reflowed solder connecting the integrated circuit die to the conductive traces; and
   oxide bump pads on portions of the conductive traces within the cavity.

8. The integrated circuit package of claim 5, further comprising:
   a printed circuit board substrate on which the die carrier is mounted with the standoff posts in contact with the printed circuit board substrate;
   solder connecting the conductively clad standoff posts to conductive traces on the printed circuit board substrate.

9. A method of packaging an integrated circuit, comprising:
   forming a die carrier having:
      a central cavity for receiving an integrated circuit die, the central cavity having sloped sidewalls and a flat bottom; and
      a plurality of conductively clad standoff posts integrally formed with the die carrier and extending from a surface of the die carrier around the central cavity; and
   forming a plurality of conductive traces on a surface of the die carrier, each of the plurality of conductive traces extending from one of the plurality of standoff posts over the surface of the die carrier around the central cavity, over the sloped sidewalls of the central cavity, and at least partially over the flat bottom of the central cavity.

10. The method of claim 9, wherein the step of forming a plurality of conductive traces on a surface of the die carrier further comprises:
   forming each of the plurality of conductive traces to terminate, at an end within the central cavity, in a bonding pad for wire bonding connection of the integrated circuit die to the conductive traces.

11. The method of claim 9, wherein the step of forming a plurality of conductive traces on a surface of the die carrier further comprises:
   forming each of the plurality of conductive traces to terminate, at an end within the central cavity, in a bonding pad for solder ball connection of the integrated circuit die to the conductive traces.

12. The method of claim 9, wherein step of forming a die carrier further comprises:
   forming the central cavity with a depth approximately equal to a thickness of the integrated circuit die.

13. The method of claim 9, further comprising:
   mounting the integrated circuit die within the die cavity;
   securing the integrated circuit die to the die carrier with a resin.

14. The method of claim 13, further comprising:
   connecting the integrated circuit die to the conductive traces with wire bonds; and
   encapsulating the integrated circuit die and the wire bonds with an encapsulation cap.

15. The method of claim 13, further comprising:
   forming oxide bump pads on portions of the conductive traces within the bottom of the cavity; and
   reflowing solder balls to connect the integrated circuit die to the conductive traces.

16. The method of claim 13, further comprising:
   mounting the die carrier on a printed circuit board substrate with the standoff posts in contact with the printed circuit board substrate;
   connecting the conductively clad standoff posts to conductive traces on the printed circuit board substrate with solder.

17. A integrated circuit package substrate, comprising:
   a substrate having a plurality of die carriers formed therein, each die carrier having:
      a central cavity for receiving an integrated circuit die, the central cavity having sloped sidewalls and a flat bottom; and
      a plurality of conductively clad standoff posts integrally formed with the die carrier and extending from a surface of a respective die carrier around the central cavity; and
   patterned conductive traces on a surface of each die carrier, each of the patterned of conductive traces extending from one of the plurality of standoff posts over the surface of the respective die carrier around the central cavity in that die carrier, over the sloped sidewalls of the central cavity in that die carrier, and at least partially over the flat bottom of the central cavity in that die carrier.

18. The integrated circuit package substrate of claim 17, further comprising:

conductive cladding around a portion of each of the standoff posts;

a reduced diameter tip on each of the standoff posts for receiving solder connecting the conductive cladding to a conductive trace on a printed circuit board; and a support edge surrounding the plurality of die carriers.

19. The integrated circuit package substrate of claim 18, wherein each of the conductive traces on a die carrier terminates, at an end in the bottom of the central cavity for that die carrier, with a wire bonding pad.

20. The integrated circuit package substrate of claim 18, wherein each of the conductive traces on a die carrier terminates, at an end in the bottom of the central cavity for that die carrier, with a solder ball pad.

21. A method of forming an integrated circuit package, comprising:

forming a plurality of die carriers within an LCP substrate, wherein each of the plurality of plurality of die carriers includes:

a central cavity having sloped sidewalls and a bottom; and a plurality of standoff posts integrally formed with the die carrier and protruding from a surface of the die carrier surrounding the central cavity;

forming a layer of conductive material around the standoff post, over the surface of each die carrier surrounding the central cavity in that die carrier, and over the sloped sidewalls and the bottom of the central cavity in that die carrier; and employing a laser to removing portions of the conductive material over the surface of each die carrier surrounding the central cavity in that die carrier and over the sidewalls and bottoms of the central cavity in that die carrier to leave conductive traces extending from each standoff post to the bottom of the central cavity in the die carrier including that standoff posts.

22. The method of claim 21, further comprising:

employing the laser to form oxide bump pads on conductive traces proximate to and end of the conductive trace in the bottom of the central cavity in the die carrier on which the conductive trace is formed.

* * * * *